United States Patent
Litton et al.

(10) Patent No.: US 7,226,672 B2
(45) Date of Patent: *Jun. 5, 2007

(54) TURBINE COMPONENTS WITH THERMAL BARRIER COATINGS

(75) Inventors: David A. Litton, Rocky Hill, CT (US); Nicholas E. Ulion, Marlborough, CT (US); Mladen F. Trubelja, Manchester, CT (US); Michael J. Maloney, Marlborough, CT (US); Sunil Govinda Warrier, Middletown, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/803,527

(22) Filed: Mar. 17, 2004

(65) Prior Publication Data

US 2004/0175597 A1    Sep. 9, 2004

Related U.S. Application Data

(63) Continuation-in-part of application No. 10/641,585, filed on Aug. 12, 2003, and a continuation-in-part of application No. 10/226,108, filed on Aug. 21, 2002, now Pat. No. 6,730,422.

(51) Int. Cl.
*B32B 9/00* (2006.01)
*B32B 9/04* (2006.01)
*F03B 3/12* (2006.01)

(52) U.S. Cl. .................. 428/701; 428/446; 428/688; 428/689; 416/241 B; 416/241 R

(58) Field of Classification Search ............... 428/632, 428/633, 697, 698, 699, 701, 702; 416/241 B
See application file for complete search history.

(56) References Cited

U.S. PATENT DOCUMENTS

| | | | |
|---|---|---|---|
| 3,634,113 A | | 1/1972 | Fehrenbacher |
| 3,957,500 A | | 5/1976 | Pitts |
| 4,535,033 A | | 8/1985 | Stecura |
| 4,774,150 A | * | 9/1988 | Amano et al. ............... 428/690 |
| 4,939,107 A | | 7/1990 | Ketcham |
| 5,059,095 A | * | 10/1991 | Kushner et al. ........ 416/241 B |
| 5,288,205 A | | 2/1994 | Jones |
| 5,572,725 A | * | 11/1996 | Morris et al. ................ 428/555 |
| 5,658,837 A | | 8/1997 | Quadir |
| 5,789,330 A | * | 8/1998 | Kondo et al. ................ 501/103 |
| 5,863,668 A | * | 1/1999 | Brindley et al. ............. 428/612 |
| 5,985,470 A | * | 11/1999 | Spitsberg et al. ........... 428/689 |
| 6,025,078 A | | 2/2000 | Rickerby et al. |
| 6,044,830 A | | 4/2000 | Jones |
| 6,117,560 A | | 9/2000 | Maloney |
| 6,127,006 A | | 10/2000 | Schulz et al. |
| 6,187,453 B1 | | 2/2001 | Maloney |
| 6,258,467 B1 | | 7/2001 | Subramanian |
| 6,284,323 B1 | | 9/2001 | Maloney |
| 6,333,090 B1 | | 12/2001 | Schulz et al. |
| 6,333,118 B1 | | 12/2001 | Alperine et al. |
| 6,558,814 B2 | * | 5/2003 | Spitsberg et al. ............ 428/633 |
| 6,586,115 B2 | * | 7/2003 | Rigney et al. ............... 428/633 |
| 6,607,852 B2 | * | 8/2003 | Spitsberg et al. ............ 428/702 |
| 6,730,422 B2 | * | 5/2004 | Litton et al. ................. 428/701 |
| 6,733,908 B1 | * | 5/2004 | Lee et al. ..................... 428/702 |
| 6,759,151 B1 | * | 7/2004 | Lee .............................. 428/701 |
| 6,812,176 B1 | * | 11/2004 | Zhu et al. ..................... 501/102 |
| 6,844,075 B1 | * | 1/2005 | Saak et al. ................... 428/446 |
| 6,924,040 B2 | * | 8/2005 | Maloney ...................... 428/472 |
| 2003/0138641 A1 | * | 7/2003 | Fukudome et al. ......... 428/446 |
| 2004/0028941 A1 | * | 2/2004 | Lane et al. .................. 428/689 |
| 2004/0197580 A1 | * | 10/2004 | Dorfman et al. ............ 428/472 |

FOREIGN PATENT DOCUMENTS

| | | |
|---|---|---|
| EP | 0 595 451 A1 | 5/1994 |
| EP | 0 812 931 A1 | 12/1997 |
| EP | 0 825 271 A1 | 2/1998 |
| EP | 1 044 943 A1 | 4/2000 |
| EP | 1 249 515 A2 | 10/2002 |
| EP | 1 295 965 A2 | 3/2003 |
| WO | WO 97/01436 | 1/1997 |
| WO | WO 99/42630 | 8/1999 |
| WO | WO 02/14580 A2 | 2/2002 |

* cited by examiner

*Primary Examiner*—Jennifer McNeil
*Assistant Examiner*—Elizabeth D. Ivey
(74) *Attorney, Agent, or Firm*—Bachman & LaPointe

(57) ABSTRACT

A turbine component has a substrate formed from a ceramic material selected from the group consisting of a monolithic ceramic material and a composite ceramic material and a thermal barrier coating bonded to the substrate. In one embodiment, the ceramic material forming the substrate is selected from the group of silicon nitride and self-reinforced silicon nitride. In another embodiment, the ceramic material forming the substrate is selected from the group consisting of a silicon carbide-silicon carbide material and a carbon-carbon material. At least one bond coat layer may be interposed between the substrate and the thermal barrier coating.

48 Claims, No Drawings

TURBINE COMPONENTS WITH THERMAL BARRIER COATINGS

CROSS-REFERENCE TO RELATED APPLICATION(S)

The present application is a continuation in part application of allowed U.S. patent application Ser. No. 10/226,108 to Litton et al., filed Aug. 21, 2002, entitled THERMAL BARRIER COATINGS WITH LOW THERMAL CONDUCTIVITY and a continuation in part application of U.S. patent application Ser. No. 10/641,585 to Litton et al., filed Aug. 12, 2003, entitled THERMAL BARRIER COATINGS WITH LOW THERMAL CONDUCTIVITY.

BACKGROUND OF THE INVENTION

The present invention relates to turbine components having a substrate formed from a ceramic material, such as a monolithic ceramic or a composite ceramic material, and a thermal barrier coating made from ceramic materials.

Gas turbine engines are well developed mechanisms for converting chemical potential energy, in the form of fuel, to thermal energy and then to mechanical energy for use in propelling aircraft, generating electrical power, pumping fluids, etc. At this time, the major available avenue for improved efficiency of gas turbine engines appears to be the use of higher operating temperatures. However, the metallic materials used in gas turbine engines are currently very near the upper limits of their thermal stability. In the hottest portion of modern gas turbine engines, metallic materials are used at gas temperatures above their melting points. They survive because they are air cooled. But providing air cooling reduces engine efficiency.

Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

Such coatings are invariably based on ceramic. Mullite and alumina have been proposed, but zirconia is the current material of choice. Zirconia must be modified with a stabilizer to prevent the formation of the monoclinic phase. Typical stabilizers include yttria, calcia, ceria, and magnesia.

Zirconia based ceramics are resistant to water attack. This is critical for land-based gas turbine applications, since the coatings are exposed at high temperatures for much longer than they are in aeroengine applications. Thus, corrosion of the thermal barrier coating can become a problem—indeed it is known to be a problem for silica-based thermal barrier coatings and alumina-based thermal barrier coatings. Steam is often injected into the combustor of land-based gas turbines to reduce nitric oxide formation, which exacerbates the water attack issue.

Despite the success with thermal barrier coatings, there is a continuing desire for improved coatings which exhibit superior thermal insulation capabilities, especially those improved in insulation capabilities when normalized for coating density. Weight is always a critical factor when designing gas turbine engines, particularly rotating parts. Ceramic thermal barrier coatings are not load supporting materials, and consequently they add weight without increasing strength. There is a strong desire for a ceramic thermal barrier material which adds the minimum weight while providing the maximum thermal insulation capability. In addition, there are the normal desires for long life, stability and economy.

SUMMARY OF THE INVENTION

Accordingly, it is an object of the present invention to provide a turbine component having a ceramic material substrate and a thermal barrier coating having low thermal conductivity.

The foregoing object is attained by the turbine component of the present invention.

In accordance with the present invention, a turbine component is provided which broadly has a ceramic material substrate and a thermal barrier coating. The ceramic material substrate may be a monolithic ceramic material or a composite ceramic material. In a first embodiment of the present invention, the thermal barrier coating broadly comprises at least 15 mol % of at least one lanthanide sesquioxide and the balance comprising a first oxide selected from the group consisting of zirconia, ceria, and hafnia. The first oxide is preferably present in an amount greater than 50 mol %. The at least one lanthanide sesquioxide has a formula $A_2O_3$ where A is selected from the group consisting of La, Pr, Nd, Sm, Eu, Tb, and mixtures thereof.

In a second embodiment of the present invention, the thermal barrier coating broadly comprises greater than 30 mol % $Sc_2O_3$, a lanthanide sesquioxide having a formula $A_2O_3$ where A is selected from the group consisting of Nd, Eu, Dy, Gd, Er, Pr, and mixtures thereof, and the balance zirconia.

In a third embodiment of the present invention, the thermal barrier coating broadly comprises more than 20 mol % $In_2O_3$, a lanthanide sesquioxide having a formula $A_2O_3$ where A is selected from the group consisting of Er, Nd, Eu, Dy, Gd, Pr, and mixtures thereof, and the balance zirconia.

In a fourth embodiment of the present invention, the thermal barrier coating broadly comprises from 5 to 60 mol % of at least one of $La_2O_3$ and $Sm_2O_3$, and from 5 to 60 mol % of at least one oxide having a formula $A_2O_3$ where A is selected from the group consisting of Sc, In, Y, Pr, nd, Eu, Gd, Dy, Er, Yb, and mixtures thereof, and the balance zirconia.

In a fifth embodiment of the present invention, the thermal barrier coating broadly comprises from 0.5 to 22.5 mol % of at least one first oxide having a formula $A_2O_3$ where A is selected from the group consisting of La, Sm, Tb, Tm, and Lu combined with a second oxide selected from the group consisting of zirconia, hafnia, and ceria.

In a sixth embodiment of the present invention, the thermal barrier coating broadly comprises from 0.5 to 1.0 mol % of at least one first oxide from the group consisting of $CeO_2$, $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, $Y_2O_3$, and mixtures thereof, combined with a second oxide selected from the group consisting of zirconia, hafnia, and ceria.

In a seventh embodiment of the present invention, the thermal barrier coating broadly comprises 20.5 to 22.5 mol % of $CeO_2$ combined with an oxide selected from the group consisting of zirconia, hafnia, and ceria.

In an eighth embodiment of the present invention, the thermal barrier coating broadly comprises from 0.5 to 22.0 mol % of $CeO_2$, and from 0.5 to 22.0 mol % of at least one first oxide selected from the group consisting of $La_2O_3$, $Sm_2O_3$, $Tb_2O_3$, $Tm_2O_3$, $HO_2O_3$, $Lu_2O_3$, MgO, CaO, $Pr_2O_3$, $Nd_2O_3$, $Eu_2O_3$, $Gd_2O_3$, $Dy_2O_3$, $Er_2O_3$, $Yb_2O_3$, and mixtures thereof, combined with a second oxide selected from the group consisting of zirconia and hafnia. The $CeO_2$ and the at least one first oxide being present in an amount no greater than 22.5 mol %.

In a ninth embodiment, the thermal barrier coating broadly comprises from 0.5 to 22.5 mol % $CeO_2$, from 0.5 to 59.5 mol % of at least one oxide selected from the group consisting of $In_2O_3$, $Sc_2O_3$, and mixtures thereof, combined with at least 40 mol % of an oxide selected from the group consisting of zirconia and hafnia.

In a tenth embodiment, the thermal barrier coating broadly comprises from 9.0 to 22.5 mol % of at least one first oxide selected from the group consisting of $Pr_2O_3$, $Nd_2O_3$, $Eu_2O_3$, $Er_2O_3$, and mixtures thereof, combined with a second oxide selected from the group consisting of zirconia, hafnia, and ceria.

In an eleventh embodiment, the thermal barrier coating broadly comprises from 15.0 to 22.5 mol % of a first oxide selected from the group consisting of $Dy_2O_3$ and $Yb_2O_3$ combined with at least 77.5 mol % of a second oxide selected from the group consisting of zirconia, hafnia, and ceria.

In a twelfth embodiment, the thermal barrier coating broadly comprises from 0.5 to 59.5 mol % of $Dy_2O_3$ and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of zirconia, hafnia, and ceria.

In a thirteenth embodiment, the thermal barrier coating broadly comprises from 0.5 to 22.5 mol % of $Yb_2O_3$ and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of zirconia, hafnia, and ceria.

In a fourteenth embodiment, the thermal barrier coating broadly comprises 20.5 to 60 mol % of at least one oxide selected from the group consisting of $In_2O_3$, $Sc_2O_3$, MgO, CaO, and mixtures thereof, combined with at least 40 mol % of an oxide selected from the group consisting of zirconia, hafnia, and ceria.

In a fifteenth embodiment, the thermal barrier coating broadly comprises from 15 to 59.5 mol % of $Y_2O_3$, from 0.5 to 45.0 mol % of at least one first oxide selected from the group consisting of $La_2O_3$, $Sm_2O_3$, $Tb_2O_3$, $Tm_2O_3$, $HO_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of an oxide selected from the group consisting of zirconia, hafnia, and ceria.

In a sixteenth embodiment, the thermal barrier coating broadly comprises from 9.0 to 23.0 mol % $Gd_2O_3$, from 0.5 to 51.0 mol % of at least one first oxide selected from the group consisting of $La_2O_3$, $Sm_2O_3$, $Tb_2O_3$, $Tm_2O_3$, $HO_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of an oxide selected from the group consisting of zirconia, hafnia, and ceria.

Other details of the turbine components with thermal barrier coatings of the present invention, as well as other objects and advantages attendant thereto, are set forth in the following detailed description.

DETAILED DESCRIPTION OF THE PREFERRED EMBODIMENT(S)

The essence of the present invention arises from the discovery that certain ceramic materials have great utility as thermal barrier coatings on ceramic material substrates, particularly those used to form components, such as the airfoils, of turbine engine components. These ceramic coating materials have such utility because they exhibit lower thermal conductivity that conventional thermal barrier coatings such as 7 weight % yttria stabilized zirconia.

In accordance with the present invention, a first embodiment of a thermal barrier coating which exhibits such a lower thermal conductivity comprises at least 15 mol % of at least one lanthanide sesquioxide and the balance comprising a first oxide selected from the group consisting of zirconia, ceria, and hafnia. Preferably, the first oxide is present in an amount greater than 50 mol %. Each lanthanide sesquioxide has a formula $A_2O_3$ where A is selected from the group consisting of La, Pr, Nd, Sm, Eu, Tb, and mixtures thereof. In a preferred embodiment, the at least one lanthanide sesquioxide is present in a total amount in the range of 15 to 45 mol %. In a most preferred embodiment, the at least one lanthanide sesquioxide is present in a total amount of at least 25 mol %. In the thermal barrier coatings of the present invention, where the first oxide is zirconia, each zirconium ion has more than one adjacent oxide vacancy on average, and preferably at least two adjacent oxide vacancies. If the first oxide is hafnia or ceria, each hafnium ion and each cerium ion would also have more than one adjacent oxide vacancy on average, and preferably at least two adjacent oxide vacancies. The presence of these oxygen vacancies minimizes the thermal conductivity of the coating. Thus, they are a highly desirable feature of the coatings of the present invention.

A second thermal barrier coating in accordance with the present invention comprises a lanthanide sesquioxide present in an amount from 5 to 60 mol % and the balance comprising a first oxide selected from the group consisting of zirconia, hafnia, and ceria. The lanthanide sesquioxide has a formula $A_2O_3$ where A is selected from the group consisting of In, Sc, Y, Dy, Ho, Er, Tm, Yb, Lu, and mixtures thereof. In a preferred embodiment of this coating, the lanthanide sesquioxide is present in an amount from 10 to 40 mol %.

A third embodiment of a thermal barrier coating comprises a lanthanide sesquioxide and the balance comprising a first oxide selected from the group consisting of zirconia, hafnia, ceria, and mixtures thereof. The lanthanide sesquioxide is present in an amount sufficient to create more than one oxygen vacancy on average adjacent each zirconium, hafnium, and cerium ions.

A fourth embodiment of a thermal barrier coating having a lower thermal conductivity in accordance with the present invention comprises from 15 to 60 mol % of a lanthanide sesquioxide having a formula $A_2O_3$ where A is selected from the group consisting of Er, Nd, Yb, Eu, Dy, Pr, Sm, La, and mixtures thereof, and the balance zirconia. The thermal barrier coating preferably contains less than 10 vol % of phases with a pyrochlore crystal structure. Zirconia is preferably present in an amount greater than 40 mol %. The thermal barrier coating may also contain one or more of the following constituents: from 0.001 to 2.5 mol % yttria, from 0.001 to 10 mol % of at least one of CaO and MgO, from 0.001 to 1.0 mol % $Yb_2O_3$, from 0.001 to 4.0 mol % $Sc_2O_3$, and/or from 0.001 to 4.0 mol % $In_2O_3$.

A fifth embodiment of a thermal barrier coating in accordance with the present invention which exhibits a lower thermal conductivity comprises at least 15 mol % yttria, and a lanthanide sesquioxide having a formula $A_2O_3$ where A is selected from the group consisting of Er, Nd, Yb, Eu, Dy, Gd, Pr, and mixtures thereof, and the balance zirconia. In a preferred embodiment, the zirconia is present in an amount greater than 40 mol % and the coating contains less than 10 vol % of phases with a pyrochlore crystal structure. The yttria in this coating system may be present in an amount in the range of 15 to 22 mol % and the lanthanide sesquioxide may be present in an amount from 1.0 to 35 mol %. In a particularly useful embodiment of this thermal barrier coating system, yttria is present in an amount greater than 22 mol % and the lanthanide sesquioxide is present in an amount from 1.0 to 38 mol %.

In a sixth embodiment of the present invention, a thermal barrier coating having a lower thermal conductivity comprises from 9 to 15 mol % $Yb_2O_3$, and from 1.0 to 48 mol % of a lanthanide sesquioxide having a formula $A_2O_3$ where A is selected from the group consisting of Er, Nd, Eu, Dy, Gd, Pr, and mixtures thereof, and the balance zirconia. The zirconia is present in an amount greater than 40 mol % and the coating has less than 10 vol % of a pyrochlore crystal structure.

A seventh embodiment of a thermal barrier coating in accordance with the present invention comprises greater than 15 mol % $Yb_2O_3$ and a lanthanide sesquioxide having a formula $A_2O_3$ where A is selected from the group consisting of Er, Nd, Eu, Dy, Gd, Pr, and mixtures thereof, and the balance zirconia. The zirconia is preferably present in an amount greater than 40 mol %. Further, the coating preferably contains less than 10 vol % of phases with a pyrochlore crystal structure. The lanthanide sesquioxide may be present in an amount from 0.001 to 45 mol %.

In an eighth embodiment of the present invention, a thermal barrier coating is provided which comprises from 20 to 30 mol % $Sc_2O_3$ and a lanthanide sesquioxide having a formula $A_2O_3$ where A is selected from the group consisting of Er, Nd, Eu, Dy, Gd, Pr, and mixtures thereof, and the balance zirconia. As before, the zirconia is preferably present in an amount greater than 40 mol %. Further, the thermal barrier coating has less than 10 vol % of phases with a pyrochlore crystal structure. In a preferred embodiment, the lanthanide sesquioxide is present in an amount from 0.001 to 30 mol %.

In a ninth embodiment of the present invention, a thermal barrier coating is provided which comprises greater than 30 mol % $Sc_2O_3$, a lanthanide sesquioxide having a formula $A_2O_3$ where A is selected from the group consisting of Nd, Eu, Dy, Gd, Er, Pr, and mixtures thereof, and the balance zirconia. The zirconia is preferably present in an amount greater than 40 mol %. The thermal barrier coating may have less than 10 vol % of phases with a pyrochlore crystal structure. In a preferred embodiment, the lanthanide sesquioxide is present in an amount in the range of 0.001 to 30 mol %.

In a tenth embodiment of the present invention, a thermal barrier coating comprises from 11 to 20 mol % $In_2O_3$ and a lanthanide sesquioxide having a formula $A_2O_3$ where A is selected from the group consisting of Er, Nd, Eu, Dy, Gd, Pr, and mixtures thereof, and the balance zirconia. In a preferred embodiment, the lanthanide sesquioxide is present in an amount from 0.001 to 36 mol %. The zirconia is preferably present in an amount greater than 40 mol %. The coating also preferably contains less than 10 vol % of phases with a pyrochlore structure.

In an eleventh embodiment, a thermal barrier coating is provided which comprises more than 20 mol % $In_2O_3$, and a lanthanide sesquioxide having a formula $A_2O_3$ where A is selected from the group consisting of Er, Nd, Eu, Dy, Gd, Pr, and mixtures thereof, and the balance zirconia. In this coating system, the zirconia is preferably present in an amount greater than 40 mol %, the lanthanide sesquioxide is preferably present in an amount from 0.001 to 40 mol %, and the coating contains less than 10 vol % of phases with a pyrochlore structure.

In a twelfth embodiment of the present invention, a thermal barrier coating comprises from 5 to 60 mol % of at least one of $La_2O_3$ and $Sm_2O_3$, from 5 to 60 mol % of at least one oxide having the formula $A_2O_3$ where A is selected from the group consisting of Sc, In, Y, Pr, Nd, Eu, Sm, Gd, Dy, Er, Yb, and mixtures thereof, and the balance zirconia. In this coating system, the zirconia is preferably present in an amount greater than 40 mol % and the coating contains less than 10 vol % of phases with a pyrochlore structure.

Other embodiments of thermal barrier coatings in accordance with the present invention include the following:

A thermal barrier coating comprising from 0.5 to 22.5 mol % of at least one first oxide having a formula $A_2O_3$ where A is selected from the group consisting of La, Sm, Tb, Tm, and Lu combined with a second oxide selected from the group consisting of zirconia, hafnia, and ceria. In a preferred embodiment, the second oxide is present in an amount of at least 77.5 mol %. The coating may also contain from 0.5 to 59.5 mol % of at least one third oxide from the group consisting of $In_2O_3$, $Sc_2O_3$, $Y_2O_3$, MgO, CaO, and mixtures thereof with the second oxide being present in an amount greater than 40 mol % when the third oxide is present. Still further, the coating, in another variation, may contain from 0.5 to 22.5 mol % of at least one third oxide selected from the group consisting of $CeO_2$, $Pr_2O_3$, $Nd_2O_3$, $Eu_2O_3$, $Gd_2O_3$, $Dy_2O_3$, $Er_2O_3$, $Yb_2O_3$, and mixtures thereof, and trhe at least one first oxide and the at least one third oxide being present in a total content no greater than 22.5 mol %.

A thermal barrier coating comprising from 0.5 to 1.0 mol % of at least one first oxide from the group consisting of $CeO_2$, $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, $Y_2O_3$, and mixtures thereof, combined with a second oxide selected from the group consisting of zirconia, hafnia, and ceria. The thermal barrier coating may also contain from 0.5 to 22.5 mol % of at least one third oxide selected from the group consisting of $La_2O_3$, $Sm_2O_3$, $Tb_2O_3$, $Tm_2O_3$, $HO_2O_3$, $Lu_2O_3$, MgO, CaO, and mixtures thereof, with the at least one first oxide and the at least one third oxide being present in a total amount of no greater than 22.5 mol %, and the second oxide being present in an amount of at least 77.5 mol %.

A thermal barrier coating comprising from 20.5 to 22.5 mol % of $CeO_2$ combined with an oxide selected from the group consisting of zirconia and hafnia. In a preferred embodiment, the oxide is present in an amount of at least 77.5 mol %.

A thermal barrier coating comprising from 0.5 to 22.0 mol % of $CeO_2$, and from 0.5 to 22.0 mol % of at least one first oxide selected from the group consisting of $La_2O_3$, $Sm_2O_3$, $Tb_2O_3$, $Tm_2O_3$, $HO_2O_3$, $Lu_2O_3$, MgO, CaO, $Pr_2O_3$, $Nd_2O_3$, $Eu_2O_3$, $Gd_2O_3$, $Dy_2O_3$, $Er_2O_3$, $Yb_2O_3$, and mixtures thereof, combined with a second oxide selected from the group consisting of zirconia and hafnia, and the $CeO_2$ and the at least one first oxide being present in an amount no greater than 22.5 mol %. In a preferred embodiment, the second oxide is present in an amount of at least 77.5 mol %.

A thermal barrier coating comprising from 0.5 to 22.5 mol % $CeO_2$, from 0.5 to 59.5 mol % of at least one oxide selected from the group consisting of $In_2O_3$, $Sc_2O_3$, and mixtures thereof, combined with at least 40 mol % of an oxide selected from the group consisting of zirconia and hafnia.

A thermal barrier coating comprising from 9.0 to 22.5 mol % of at least one first oxide selected from the group consisting of $Pr_2O_3$, $Nd_2O_3$, $Eu_2O_3$, $Er_2O_3$, and mixtures thereof combined with a second oxide selected from the group consisting of zirconia, hafnia, and ceria. In a preferred embodiment, the second oxide is present in an amount greater than 77.5 mol %. The thermal barrier coating may further comprise from 0.5 to 51.0 mol % of at least one third oxide selected from the group consisting of $Yb_2O_3$, $In_2O_3$, $Sc_2O_3$, $Y_2O_3$, $Gd_2O_3$, MgO, CaO, and mixtures thereof with the second oxide being present in an amount of at least 40 mol %.

A thermal barrier coating comprising from 15.0 to 22.5 mol % of a first oxide selected from the group consisting of $Dy_2O_3$ and $Yb_2O_3$ combined with at least 77.5 mol % of a second oxide selected from the group consisting of zirconia, hafnia, and ceria.

A thermal barrier coating comprising from 0.5 to 59.5 mol % of $Dy_2O_3$ and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of zirconia, hafnia, and ceria.

A thermal barrier coating comprising from 0.5 to 22.5 mol % of $Yb_2O_3$, and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of zirconia, hafnia, and ceria.

A thermal barrier coating comprising from 20.5 to 60 mol % of at least one oxide selected from the group consisting of $In_2O_3$, $Sc_2O_3$, and $Y_2O_3$, combined with at least 40 mol % of an oxide selected from the group consisting of zirconia, hafnia, and ceria.

A thermal barrier coating comprising from 15 to 59.5 mol % of $Y_2O_3$, from 0.5 to 45.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of an oxide selected from the group consisting of zirconia, hafnia, and ceria.

A thermal barrier coating comprising from 9.0 to 23.0 mol % $Gd_2O_3$, from 0.5 to 51.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of an oxide selected from the group consisting of zirconia, hafnia, and ceria.

The various thermal barrier coatings set forth herein may be characterized with a columnar structure.

An article, having particular utility as a component in a gas turbine engine, may be provided in accordance with the present invention. The article may have a metal substrate and one of the aforementioned thermal barrier coatings applied to the substrate. The thermal barrier coating may be applied directly to a surface of the substrate or may be applied to a bond coat deposited on one or more surfaces of the metal substrate. Any suitable technique known in the art may be used to deposit a thermal barrier coating in accordance with one of the embodiments of the present invention. Suitable techniques include electron beam physical vapor deposition, chemical vapor deposition, LPPS techniques, and diffusion processes. The metal substrate may comprise one of a nickel based superalloy, a cobalt based superalloy, a ferrous alloy such as steel, a titanium alloy, and a copper alloy.

In lieu of a metal substrate, the turbine component or article may have a substrate formed from ceramic material such as a monolithic ceramic material or a composite ceramic material. As used herein, the term "monolithic ceramic" is meant to include, but is not limited to, single-phase or multi-phase ceramics, but not ceramics processed as composites (i.e. infiltrated fiber weaves, etc.). Examples of monolithic ceramic substrates include, but are not limited to, silicon nitride and also self-reinforced silicon nitride. Examples of composite ceramic substrates include, but are not limited to, SiC—SiC composites (vapor- or melt-infiltrated 2D or 3D fiber weaves) and C—C composites (again, vapor- or melt-infiltrated 2D or 3D fiber weaves).

When a bond coat is used, the bond coat may comprise any suitable bond coat known in the art. For example, the bond coat may be formed from an aluminum containing material, an aluminide, a platinum aluminide, a ceramic material, such as 7 wt % yttria stabilized zirconia, or a MCrAlY material. Alternatively, the bond coat may be multiple layers of ceramics which are designed to provide coefficient of thermal expansion match as well as to provide oxidation resistance (by blocking oxidation diffusion) and corrosion resistance (by blocking corrosive oxide liquid attack). Suitable bond coats may be formed from $Ta_2O_5$, all rare-earth disilicates having the formula $X_2Si_2O_7$ where X=La, Nd, Pr, Sm, Eu, Gd, Tb, Dy, Ho, Er, Tm, Yb, Lu, and mixtures thereof, $Y_2Si_2O_7$, mullite, BSAS (barium strontium alumino silicate or celsian), yttrium aluminum garnet, ytterbium aluminum garnet, and other rare-earth aluminate garents where the rare earth element is selected from the group consisting of Gd, Tb, Dy, Ho, Er, Tm, Lu, and mixtures thereof. The multiple bond coat layers may be multiple distinct layers formed from the same or different materials. Additionally, the multiple bond coat layers may be functionally graded layers of mixtures of the above. In addition to serving as matching layers and bond coat layers, these layers act as environment barriers and oxygen barriers. Functional grading may be used to replace a distinct interface between two layers of dissimilar materials with a region in which the two materials are mixed such that the overall concentration gradually changes from 100% of the first material to 100% of the second material. Thus, a step change in concentration may be replaced with a gradually sloping change in concentration. This approach is effective in reducing residual stresses, for example between layers of materials with large thermal expansion mismatches.

The bond coat may be formed on the substrate, metallic or ceramic, using any suitable process known in the art including, but not limited to, low pressure plasma spray, electron beam physical vapor deposition, diffusion processes and chemical vapor deposition processes. If desired, the bond coat may have an oxide scale on an outer surface, which oxide scale consists essentially of alumina. The thermal barrier coatings of the present invention may be bonded to the oxide scale using any suitable technique known in the art.

If desired, a ceramic layer may be bonded to the thermal barrier coating. The additional ceramic material may be selected from the group consisting of materials which reduce oxygen diffusion, provide erosion and abrasion resistance, and/or provide optical emissivity of 0.7. Examples of high emissivity ceramic materials which can be used are alumina and mullite. High emissivity reduces the heat transfer across a thermal barrier coating by internal radiation (radiation of the thermal barrier coating material itself) due to the temperature difference between the hotter outer surface of the coating and the cooler interface between the coating and the TGO, thereby reducing the temperature of the TGO, thus the bondcoat, thus the alloy. Thus, high emissivity increases the insulative properties of the TBC. The additional ceramic layer may be formed over an exterior surface of the thermal barrier coating.

In some embodiments, the article may have an oxide scale on its surfaces and one of the thermal barrier coatings of the present invention may be applied directly over and bonded to the oxide scale using any suitable deposition technique known in the art including, but not limited to, diffusion processes, electron beam physical vapor deposition, and/or chemical vapor deposition techniques. The oxide scale may consist substantially of alumina.

Although the thermal barrier coatings of the present invention were developed for application in gas turbine engines, the coatings have utility in other applications where high temperatures are encountered, such as furnaces and internal combustion engines.

The following examples are intended to show the advantages of the coatings of the present invention.

EXAMPLE 1

Samples of 27.3 mole % $Y_2O_3$, balance $ZrO_2$, were produced by cold pressing and sintering of mixed powders to a density 95% of theoretical. The sample discs, 0.025" in thickness, were coated with graphite. Specific heat and thermal diffusivity measurements were made using the laser flash apparatus. Bulk density was determined by careful measurement of the sample dimensions and weight. Thermal conductivity values of 1.95 W/mK were calculated from the data measured at 1200° F., linearly corrected to theoretical density.

EXAMPLE 2

Samples of 16.7 mole % $Y_2O_3$, 16.7 mole % $Gd_2O_3$, balance $ZrO_2$, were similarly produced by cold pressing and sintering of mixed powders to a density 90.8% of theoretical. The 0.025"-thick samples were again coated with graphite and measured in the laser flash apparatus. From careful measurements of sample weight and dimensions, the bulk density of the sample was determined. Thermal conductivity values averaging 1.37 W/mK were calculated from the data measured at 1600° F., linearly corrected to theoretical density.

EXAMPLE 3

Coatings with an average composition of 19 mole % $Sm_2O_3$, balance $ZrO_2$, were deposited by electron beam physical vapor deposition onto alumina discs. High temperature measurements of thermal diffusivity were made in the laser flash apparatus. High temperature specific heat values were estimated from previous measurements of monolithic 33 mole % $Sm_2O_3$, balance $ZrO_2$ samples. Bulk density of the samples was calculated from the changes in weight and thickness of the discs during coating, and their diameters. Thermal conductivity values averaging 1.26 W/mK were calculated from the data measured at 1400° F., with no correction made for density.

It is apparent that there has been provided in accordance with the present invention thermal barrier coatings having low thermal conductivity which fully satisfy the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

What is claimed is:

1. A turbine component having a substrate formed from a ceramic material selected from the group consisting of a monolithic ceramic material and a composite ceramic material and a thermal barrier coating bonded to said substrate, said thermal barrier coating consisting of at least 15 mol % of at least one lanthanide sesquioxide and the balance consisting of ceria.

2. A turbine component according to claim 1, wherein said ceramic material comprises a monolithic ceramic material.

3. A turbine component according to claim 1, wherein said ceramic material is selected from the group consisting of silicon nitride and self-reinforced silicon nitride.

4. A turbine component according to claim 1, wherein said ceramic material comprises a composite ceramic material.

5. A turbine component according to claim 1, wherein said ceramic material is selected from the group consisting of a silicon carbide-silicon carbide material and a carbon-carbon material.

6. A turbine component according to claim 1, wherein the at least one lanthanide sesquioxide has a formula $A_2O_3$ where A is selected from the group consisting of La, Pr, Nd, Sm, Eu, Tb, and mixtures thereof.

7. A turbine component according to claim 1, wherein said at least one lanthanide sesquioxide is present in a total amount in the range of 15 to 45 mol %.

8. A turbine component according to claim 1, wherein said at least one lanthanide sesquioxide is present in a total amount of at least 25 mol %.

9. A turbine component according to claim 1, further comprising at least one bond coat layer between said substrate and said thermal barrier coating, and said at least one bond coat layer providing coefficient of thermal expansion matching, oxidation resistance and corrosion resistance.

10. A turbine component according to claim 9, wherein said at least one bond coat is formed from a rare earth disilicate having the formula $X_2Si_2O_7$ where X is selected from the group consisting of La, Nd, Pr, Sm, Eu, Gd, Tb, Dy, Ho, Er, Tm, Yb, and Lu.

11. A turbine component according to claim 9, wherein said at least one bond coat layer comprises $Y_2Si_2O_7$.

12. A turbine component according to claim 9, wherein said at least one bond coat layer comprises mullite.

13. A turbine component according to claim 9, wherein said at least one bond coat layer comprises barium strontium alumino silicate.

14. A turbine component according to claim 9, wherein said at least one bond coat layer comprises yttrium aluminum garnet.

15. A turbine component according to claim 9, wherein said at least one bond coat layer comprises ytterbium aluminum garnet.

16. A turbine component according to claim 9, wherein said at least one bond coat layer comprises rare-earth aluminate garnets wherein the rare earth is selected from the group consisting of Gd, Tb, Dy, Ho, Er, Tm, Lu, and mixtures thereof.

17. A turbine component according to claim 9, wherein said bond coat is formed from a plurality of distinct layers.

18. A turbine component according to claim 9, wherein said bond coat is formed from a plurality of functionally graded layers.

19. A turbine component having a substrate formed from a ceramic material selected from the group consisting of a monolithic ceramic material and a composite ceramic material and a thermal barrier coating bonded to said substrate, said thermal barrier coating comprising at least one lanthanide sesquioxide and the balance comprising ceria and the ceria being present in an amount greater than 50 mol %.

20. A turbine component having a substrate formed from a ceramic material selected from the group consisting of a monolithic ceramic material and a composite ceramic material and a thermal barrier coating bonded to said substrate, the thermal barrier coating comprising greater than 30 mol % $Sc_2O_3$, said thermal barrier coating comprising at least 15 mol % of at least one lanthanide sesquioxide wherein said at least one lathanide sesquioxide comprises a lanthanide sesquioxide having a formula $A_2O_3$ where A is selected from the group consisting of Nd, Eu, Dy, Gd, Er, Pr, and mixtures thereof, and the balance being zirconia.

21. A turbine component according to claim 20, wherein said zirconia is present in an amount greater than 40 mol %.

22. A turbine component according to claim 20, wherein said coating has less than 10 vol % of phases with a pyrochlore crystal structure.

23. A turbine component according to claim 20, wherein said lanthanide sesquioxide is present in an amount in the range of from 0.001 to 30 mol %.

24. A turbine component having a substrate formed from a ceramic material selected from the group consisting of a monolithic ceramic material and a composite ceramic material and a thermal barrier coating bonded to said substrate, the thermal barrier coating comprising more than 20 mol % $In_2O_3$, said thermal barrier coating comprising at least 15 mol % of at least one lanthanide sesquioxide wherein said at least one lathanide sesquioxide comprises a lanthanide sesquioxide having a formula $A_2O_3$ where A is selected from the group consisting of Er, Nd, Eu, Dy, Gd, Pr, and mixtures thereof, and the balance being zirconia.

25. A turbine component according to claim 24, wherein said zirconia is present in an amount greater than 40 mol %.

26. A turbine component according to claim 24, wherein said coating contains less than 10 vol % of phases with a pyrochlore crystal structure.

27. A turbine component according to claim 24, wherein said lanthanide sesquioxide is present in an amount from 15 to 40 mol %.

28. A turbine component having a substrate formed from a ceramic material selected from the group consisting of a monolithic ceramic material and a composite ceramic material and a thermal barrier coating bonded to said substrate, the thermal barrier coating consisting of from 5 to 60 mol % of at least one of $La_2O_3$ and $Sm_2O_3$, and from 5 to 60 mol % of at least one oxide having a formula $A_2O_3$ where A is selected from the group consisting of Sc, In, Pr, Nd, Eu, Gd, Yb, and mixtures thereof, and the balance being zirconia.

29. A turbine component according to claim 28, wherein said zirconia is present in an amount greater than 40 mol %.

30. A turbine component according to claim 28, wherein said coating contains less than 10 vol % of phases with a pyrochlore crystal structure.

31. A turbine component having a substrate formed from a ceramic material selected from the group consisting of a monolithic ceramic material and a composite ceramic material and a thermal barrier coating bonded to said substrate, the thermal barrier coating consisting of from 0.5 to 22.5 mol % of at least one first oxide having a formula $A_2O_3$ where A is selected from the group consisting of La, Tb, Tm, and Lu combined with a second oxide selected from the group consisting of hafnia, and ceria.

32. A turbine component according to claim 31, wherein said second oxide is present in an amount of at least 77.5 mol %.

33. A turbine component having a substrate formed from a ceramic material selected from the group consisting of a monolithic ceramic material and a composite ceramic material and a thermal barrier coating bonded to said substrate, the thermal barrier coating consists of from 0.5 to 22.5 mol % of at least one first oxide having a formula $A_2O_3$ where A is selected from the group consisting of La, Tb, Tm, and Lu, a second oxide selected from the group consisting of zirconia, hafnia, and ceria, and from 0.5 to 57.5 mol % of at least one third oxide from the group consisting of $In_2O_3$, $Sc_2O_3$, MgO, CaO, and mixtures thereof and said second oxide being present in an amount greater than 40 mol %.

34. A turbine component having a substrate formed from a ceramic material selected from the group consisting of a monolithic ceramic material and a composite ceramic material and a thermal barrier coating bonded to said substrate, the thermal barrier coating consists of from 0.5 to 22.0 mol % of at least one first oxide having a formula $A_2O_3$ where A is selected from the group consisting of La, Tb, Tm, and Lu, a second oxide selected from the group consisting of hafnia, and ceria, and from 0.5 to 22.0 mol % of at least one third oxide selected from the group consisting of $Pr_2O_3$, $Nd_2O_3$, $Eu_2O_3$, $Gd_2O_3$, $Dy_2O_3$, $Er_2O_3$, $Yb_2O_3$, and mixtures thereof, and said at least one first oxide and said at least one third oxide being present in a total content less than 22.5 mol %.

35. A turbine component having a substrate formed from a ceramic material selected from the group consisting of a monolithic ceramic material and a composite ceramic material and a thermal barrier coating bonded to said substrate, the thermal barrier coating consisting of from 0.5 to 1.0 mol % of at least one first oxide from the group consisting of $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, and mixtures thereof, combined with ceria.

36. A turbine component having a substrate formed from a ceramic material selected from the group consisting of a monolithic ceramic material and a composite ceramic material and a thermal barrier coating bonded to said substrate, the thermal barrier coating consisting of from 0.5 to 1.0 mol % of at least one first oxide from the group consisting of $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, and mixtures thereof, a second oxide selected from the group consisting of hafnia, and ceria, and from 0.5 to 21.5 mol % of at least one third oxide selected from the group consisting of $La_2O_3$, $Tb_2O_3$, $Tm_2O_3$, $Ho_2O_3$, $Lu_2O_3$, CaO, and mixtures thereof, said at least one first oxide and said at least one third oxide being present in a total amount of less than 22.5 mol %, and said second oxide being present in an amount of at least 77.5 mol %.

37. A turbine component having a substrate formed from a ceramic material selected from the group consisting of a monolithic ceramic material and a composite ceramic material and a thermal barrier coating bonded to said substrate, said thermal barrier coating consisting of from 0.5 to 22.0 mol % of $CeO_2$, and from 0.5 to 22.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, and mixtures thereof, combined with hafnia, and said $CeO_2$ and the at least one first oxide being present in an amount no greater than 22.5 mol %.

38. A turbine component having a substrate formed from a ceramic material selected from the group consisting of a monolithic ceramic material and a composite ceramic material and a thermal barrier coating bonded to said substrate, said thermal barrier coating consisting of from 0.5 to 22.5 mol % of $CeO_2$, from 0.5 to 59.5 mol % of at least one oxide selected from the group consisting of $In_2O_3$, $Sc_2O_3$, and mixtures thereof, combined with at least 40 mol % hafnia.

39. A turbine component having a substrate formed from a ceramic material selected from the group consisting of a monolithic ceramic material and a composite ceramic material and a thermal barrier coating bonded to said substrate, said thermal barrier coating consisting of from 9.0 to 22.5 mol % of at least one first oxide selected from the group consisting of $Pr_2O_3$, $Nd_2O_3$, $Eu_2O_3$, and mixtures thereof, combined with a second oxide selected from the group consisting of hafnia, and ceria.

40. A turbine component according to claim 39, wherein said second oxide is present in an amount greater than 77.5 mol %.

41. A turbine component having a substrate formed from a ceramic material selected from the group consisting of a monolithic ceramic material and a composite ceramic material and a thermal barrier coating bonded to said substrate, said thermal barrier coating consisting of from 9.0 to 22.5 mol % of at least one oxide selected from the group consisting of $Pr_2O_3$, $Nd_2O_3$, $Eu_2O_3$, and mixtures thereof, a second oxide selected from the group consisting of hafnia and ceria, and from 0.5 to 51 mol % of at least one third oxide selected from the group consisting of $Yb_2O_3$, $In_2O_3$, MgO, CaO, and mixtures thereof and said second oxide being present in an amount of at least 40 mol %.

42. A turbine component having a substrate formed from a ceramic material selected from the group consisting of a monolithic ceramic material and a composite ceramic material and a thermal barrier coating bonded to said substrate, said thermal barrier coating consists of from 15 to 22.5 mol % of a first oxide selected from the group consisting of $Dy_2O_3$, and $Yb_2O_3$, combined with at least 77.5 mol % of a second oxide selected from the group consisting of hafnia, and ceria.

43. A turbine component having a substrate formed from a ceramic material selected from the group consisting of a monolithic ceramic material and a composite ceramic material and a thermal barrier coating bonded to said substrate, said thermal barrier coating consisting of from 0.5 to 59.5 mol % $Dy_2O_3$, and from 0.5 to 59.5 mol % of at least one oxide from the group consisting of $In_2O_3$, CaO, and mixtures thereof, combined with at least 43 mol % of an oxide selected from the group consisting of hafnia, and ceria.

44. A turbine component having a substrate formed from a ceramic material selected from the group consisting of a monolithic ceramic material and a composite ceramic material and a thermal barrier coating bonded to said substrate, said thermal barrier coating consisting of from 0.5 to 59.5 mol % $Yb_2O_3$, and from 0.5 to 59.5 mol % of at least one oxide from the group consisting of $In_2O_3$, CaO, and mixtures thereof, combined with at least 40 mol % of an oxide selected from the group consisting of hafnia, and ceria.

45. A turbine component having a substrate formed from a ceramic material selected from the group consisting of a monolithic ceramic material and a composite ceramic material and a thermal barrier coating bonded to said substrate, said thermal barrier coating consisting of from 20.5 to 60 mol % of at least one oxide from the group consisting of $In_2O_3$, $Sc_2O_3$, MgO, CaO, and mixtures thereof, combined with at least 40 mol % of an oxide selected from the group consisting of hafnia, and ceria.

46. A turbine component having a substrate formed from a ceramic material selected from the group consisting of a monolithic ceramic material and a composite ceramic material and a thermal barrier coating bonded to said substrate, said thermal barrier coating consisting of from 15 to 59.5 mol % $Y_2O_3$, from 0.5 to 45 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of ceria.

47. A turbine component having a substrate formed from a ceramic material selected from the group consisting of a monolithic ceramic material and a composite ceramic material and a thermal barrier coating bonded to said substrate, said thermal barrier coating consisting of from 9.0 to 23.0 mol % $Gd_2O_3$, from 0.5 to 45 mol % of at least one first oxide selected from the group consisting of $La_2O_3$, $Sm_2O_3$, $Tb_2O_3$, $Tm_2O_3$, , $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of ceria.

48. A turbine component having a substrate formed from a ceramic material selected from the group consisting of a monolithic ceramic material and a composite ceramic material and a thermal barrier coating bonded to said substrate, a bond coat layer between and in contact with said substrate and said thermal barrier coating, said bond coat layer consisting of $Ta_2O_5$.

* * * * *

UNITED STATES PATENT AND TRADEMARK OFFICE
CERTIFICATE OF CORRECTION

PATENT NO.        : 7,226,672 B2                                              Page 1 of 1
APPLICATION NO.   : 10/803527
DATED             : June 5, 2007
INVENTOR(S)       : David A. Litton et al.

It is certified that error appears in the above-identified patent and that said Letters Patent is hereby corrected as shown below:

Claim 33, line 12, "57.5" should be corrected to --59.5--.

Claim 43, line 46, "43" should be corrected to --40--.

Claim 47, line 36, after Tm2O3 the extraneous comma should be deleted.

Signed and Sealed this

Twenty-fifth Day of December, 2007

JON W. DUDAS
*Director of the United States Patent and Trademark Office*